(12) United States Patent
Sayanagi et al.

(10) Patent No.: US 7,095,292 B2
(45) Date of Patent: Aug. 22, 2006

(54) HIGH-FREQUENCY LINE TRANSDUCER, HAVING AN ELECTRODE OPENING SURROUNDED BY INNER AND OUTER VIAS

(75) Inventors: Kazuya Sayanagi, Osaka (JP); Ikuo Takakuwa, Suita (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/234,796

(22) Filed: Sep. 3, 2002

(65) Prior Publication Data

US 2003/0042993 A1 Mar. 6, 2003

(30) Foreign Application Priority Data

Sep. 4, 2001 (JP) ...................... 2001-267501

(51) Int. Cl.
*H01P 5/107* (2006.01)

(52) U.S. Cl. .......................... 333/26; 333/33
(58) Field of Classification Search .............. 333/26, 333/33, 254

See application file for complete search history.

(56) References Cited

U.S. PATENT DOCUMENTS

| | | | |
|---|---|---|---|
| 4,562,416 A | | 12/1985 | Sedivec |
| 5,202,648 A | * | 4/1993 | McCandless ................. 333/26 |
| 5,770,981 A | * | 6/1998 | Koizumi et al. ............... 333/26 |
| 5,982,250 A | * | 11/1999 | Hung et al. .................... 333/26 |
| 6,040,739 A | * | 3/2000 | Wedeen et al. ........... 333/26 X |
| 6,239,669 B1 | * | 5/2001 | Koriyama et al. ............. 333/26 |
| 6,580,335 B1 | * | 6/2003 | Iizuka et al. ................... 333/26 |

FOREIGN PATENT DOCUMENTS

| | | | |
|---|---|---|---|
| GB | 2248726 | | 4/1992 |
| JP | 0119101 | * | 5/1989 ................. 333/254 |
| JP | 4-40101 | | 2/1992 |
| JP | 6-140816 | | 5/1994 |
| JP | 08-162810 | | 6/1996 |
| JP | 11-74708 | | 3/1999 |
| JP | 11-112209 | | 4/1999 |
| JP | 02 0151225 | | 5/2000 |
| JP | 02 0174515 | | 6/2000 |

OTHER PUBLICATIONS

Japanese Patent Abstract—Publication No. 11–112209, dated Apr. 23, 1999.
German Office Action issued Apr. 30, 2004 (w/ English translation of relevant portions).
Japanese Examination Report issued Apr. 26, 2005 (w/ English translation of relevant portions).
Japanese Examination Report dispatched Sep. 13, 2005 (w/ English translation of relevant portions).

* cited by examiner

*Primary Examiner*—Benny Lee
(74) *Attorney, Agent, or Firm*—Dickstein Shapiro Morin & Oshinsky LLP

(57) ABSTRACT

On one surface of a dielectric substrate having a thickness of one quarter of a signal wavelength, a ground electrode, and a strip line, one end thereof being connected to a high-frequency element via a wire, are formed. On the opposite surface thereof, which opposes a waveguide, a ground electrode is formed, a first electrode opening having a predetermined length and width is formed, opposite to a proximity of an open end of the strip line, and a second electrode opening is formed so that a center line of a width thereof is separated outward by one quarter of the signal wavelength from a conductor wall of the waveguide. Furthermore, via holes having a length of one quarter of the signal wavelength, electrically connecting the ground electrodes on either surface, are formed. The waveguide is disposed in proximity to the dielectric substrate so that a center of the first electrode opening coincides with that of the waveguide.

10 Claims, 9 Drawing Sheets

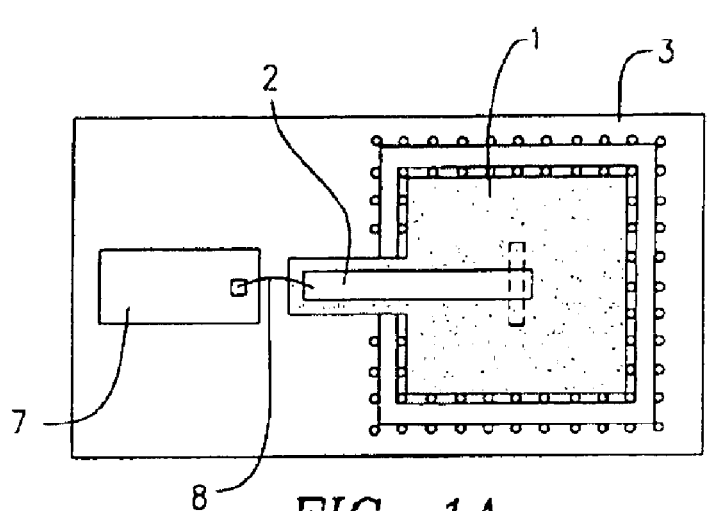
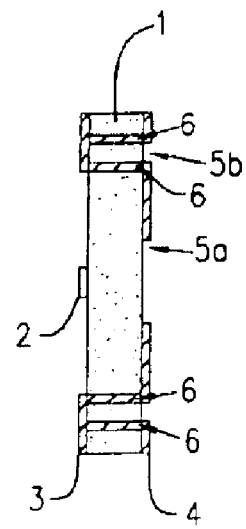
FIG. 1A
FIG. 1D
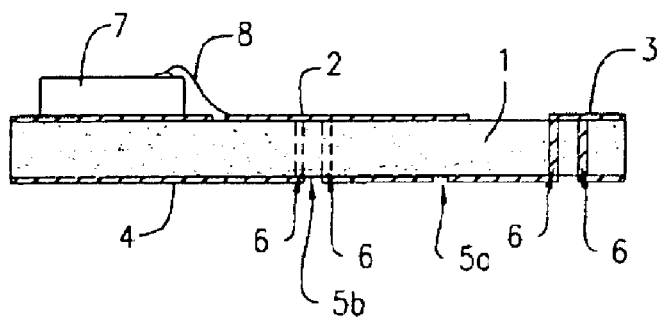
FIG. 1B
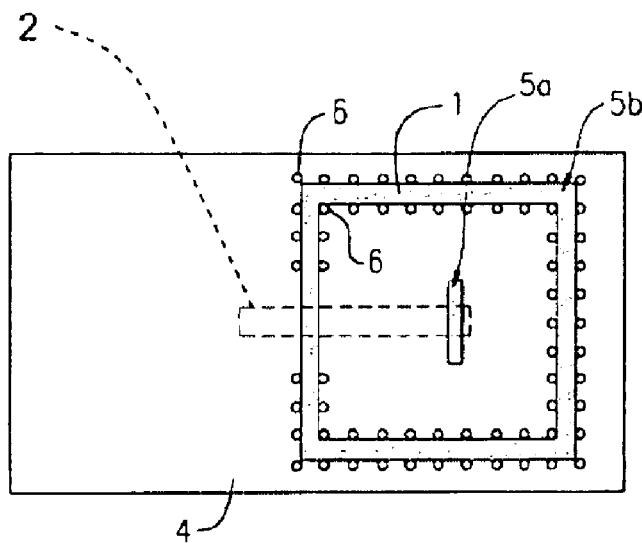
FIG. 1C

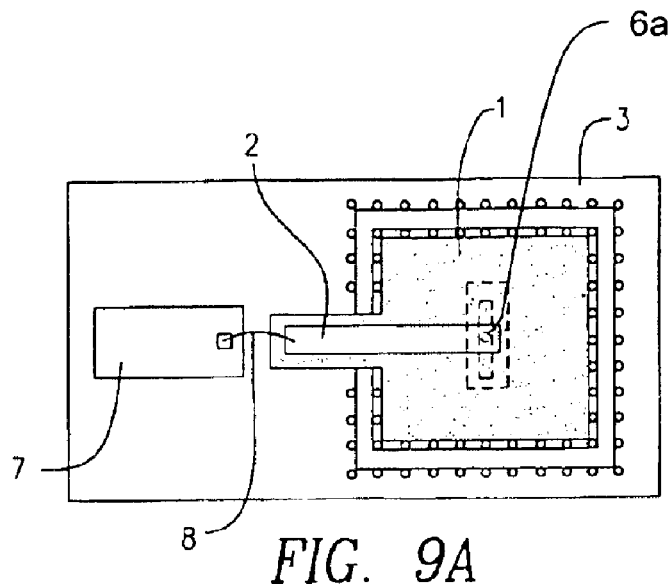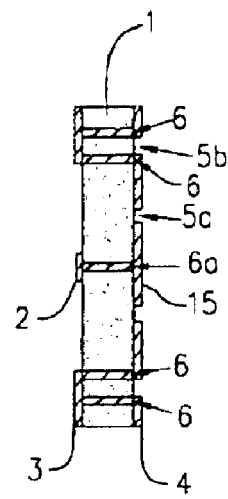
FIG. 9A
FIG. 9D
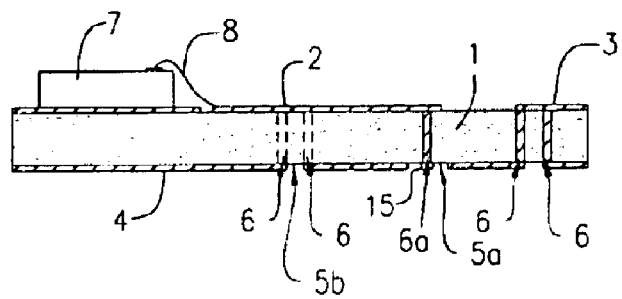
FIG. 9B
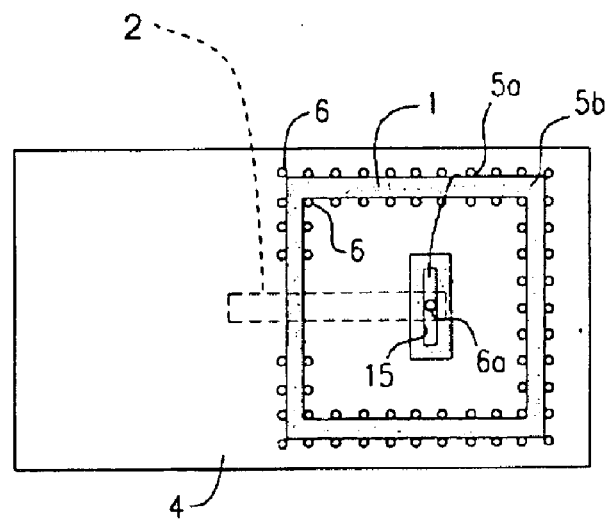
FIG. 9C

HIGH-FREQUENCY LINE TRANSDUCER, HAVING AN ELECTRODE OPENING SURROUNDED BY INNER AND OUTER VIAS

BACKGROUND OF THE INVENTION

1. Field of the Invention

The present invention relates to a line transducer for a transmission line used in the microwave band and the millimeter wave band, and a high-frequency component, module, and communication apparatus incorporating the same.

2. Description of the Related Art

A high-frequency package incorporating a line transducer in which a substrate with a transmission line formed thereon is coupled with a waveguide is disclosed in Japanese Unexamined Patent Application Publication No. 11-112209.

In the line transducer, a transmission line is formed on one surface of a dielectric substrate, one end thereof being terminated and the other end thereof being connected to a high-frequency element. On the other surface of the dielectric surface, a ground electrode (ground layer), having an opening formed in a region opposite to the terminated end, is formed. On a surface including the opening, a matching dielectric member is formed. A waveguide is electrically connected to the surface on which the ground electrode is formed so that the waveguide is centered at the opening, whereby the transmission line and the waveguide are connected to each other.

Furthermore, on the surface with the ground electrode, a second dielectric substrate provided with the matching dielectric member is laminated. On the surface of the second dielectric substrate, a conductor member is formed, and via holes or through holes connecting the conductor member and the ground electrode are formed so that the waveguide and the ground electrode are connected to each other, whereby the transmission line and the waveguide are connected to each other.

The high-frequency line transducer according to the related art, however, has had the following problems to be overcome.

In the line transducer according to the related art, the ground electrode of the transmission line and the conductor member of the waveguide must be properly connected, and an inadequate connection causes connection loss. Furthermore, when the connection is formed using a brazing alloy or the like, extrusion, insufficiency, etc. of the brazing alloy affects electrical characteristics to such an extent as to inhibit stable connection, making management of connection process difficult. This increases the amount of work required, thereby resulting in increased cost. Furthermore, when temperature changes at the connection, for example, by a thermal shock, cracking occurs at the connection, thereby considerably changing electrical characteristics. When the connection is formed using a screw, electrical characteristics are considerably affected by precision of screwing, and electrical characteristics could be degraded due to a gap or contact resistance associated with the screw.

SUMMARY OF THE INVENTION

Accordingly, it is an object of the present invention to provide a line transducer between a transmission line and a waveguide, which allows stable connection and which exhibits low loss and good transduction characteristics, and a high-frequency component, module, and communication apparatus incorporating the same.

To this end, the present invention, in one aspect thereof, provides a high-frequency line transducer in which a waveguide is coupled with a substrate having a transmission line formed thereon, wherein a ground electrode is formed in a region opposing an opening of the waveguide, and in a periphery of the region, of a surface of the substrate opposing the waveguide, which is opposite to a surface of the substrate on which the transmission line is formed; an electrode opening having a predetermined width, centered at substantially one quarter of a signal wavelength outward from a conductor wall of the opening of the waveguide; and via holes having a length substantially one quarter of the signal wavelength, electrically connecting the ground electrode on the surface opposing the waveguide to a ground electrode formed on the surface on which the transmission line is formed or to a ground electrode formed in a predetermined layer of the substrate, are formed in array on an inner periphery and an outer periphery of the electrode opening. By disposing the waveguide in proximity to the dielectric substrate so that a center of the electrode opening coincides with that of the waveguide, a line transducer of the non-contact type, which exhibits stable transmission characteristics and low loss, can be readily implemented.

Connection between the substrate and the waveguide is preferably formed using an insulating adhesive agent. Accordingly, cost is reduced as compared with a case where a brazing alloy is used.

The present invention, in another aspect thereof, provides a high-frequency component incorporating the high-frequency line transducer, which exhibits low loss and good transduction characteristics.

The present invention, in another aspect thereof, provides a high-frequency module incorporating the high-frequency component, in which loss is associated with transduction is reduced and electrical characteristics are improved.

The present invention, in another aspect thereof, provides a communication apparatus incorporating the high-frequency module, in which loss associated with transduction is reduced and communication characteristics are improved.

BRIEF DESCRIPTION OF THE DRAWINGS

FIGS. 1A, 1B, 1C and 1D are a plan view, a side sectional view, a bottom view, and a side sectional view, respectively, of a dielectric substrate of a high-frequency component incorporating a line transducer according to a first embodiment of the present invention;

FIGS. 9A, 9B, 9C and 9D are a plan view, a side sectional view, a bottom view, and a side sectional view, respectively, of a dielectric substrate of a high-frequency component incorporating a line transducer according to a seventh embodiment of the present invention;

DESCRIPTION OF THE PREFERRED EMBODIMENTS

The construction of a high-frequency component incorporating a line transducer according to a first embodiment of the present invention will be described with reference to FIGS. 1A to 1D and FIG. 2.

Figure 2:
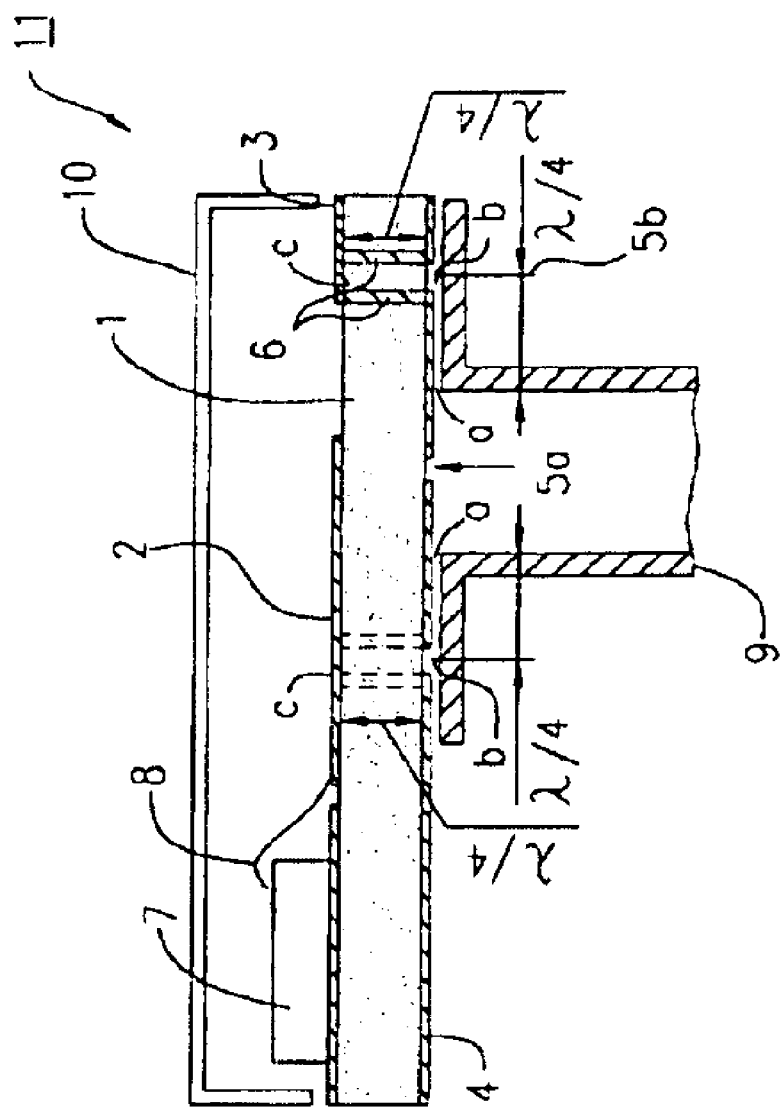
FIG. 2 is a side sectional view of the high-frequency component incorporating the line transducer according to the first embodiment.

FIGS. 1A to 1D are, respectively, a plan view, a side sectional view, a bottom view, and a side sectional view of a dielectric substrate of the high-frequency component incorporating the line transducer, and FIG. 2 is a side sectional view thereof, in which a waveguide is connected to a dielectric substrate.

Referring to FIGS. 1A to 1D, on a surface of a dielectric substrate 1, a ground electrode 3 (FIGS 1A, 1B, 1D), and a strip line 2 having one end thereof open and the other end thereof connected to a high-frequency element 7 via a wire 8 as shown in FIGS. 1A, 1B, are formed. Along the periphery of the strip line 2, an opening is formed so as to separate the strip fine 2 from the ground electrode 3. On another surface of the dielectric substrate 1, shown in FIG. 1C, a ground electrode 4 is formed, a first electrode opening 5a having a predetermined length and width is formed in a region opposite to the open end of the strip line 2, and a second electrode opening 5b having a predetermined width is formed, separated outward by a predetermined distance from the first electrode opening 5a. In the periphery of the second electrode opening 5b, a plurality of via holes 6 electrically connecting the ground electrode 3 and the ground electrode 4 are formed in an array, except in a region opposite to the strip line 2.

Referring next to FIG. 2, the dielectric substrate 1 and a waveguide 9 are disposed in proximity to each other so that a center of the first electrode opening 5a of the dielectric substrate 1 coincides with a center of the waveguide 9. The second electrode opening 5b is formed so that a center line of the width thereof is separated outward substantially by one quarter of a signal wavelength λ from a conductor wall of the waveguide 9, and the dielectric substrate 1 is also formed with a thickness of substantially one quarter of the signal wavelength λ/4. On the surface where the strip line 2 is formed, the strip line 2, the ground electrode 3, the high-frequency element 7, and the wire 8 are covered by a case 10, forming a high-frequency component 11. The high-frequency element 7 is connected to an external circuit via a transmission line other than the strip line 2.

Referring to FIG. 2, the distance between points a and b and the distance between points b and c are each λ/4, the distance between points a and c is λ/2, and the points a and b are open and the point c is short-circuited. Accordingly, a space formed between the waveguide 9 and the ground electrode 4 of the dielectric substrate 1 and a space inside the dielectric substrate 1, surrounded by the plurality of via holes 6, form a choke circuit. The choke circuit equivalently pulls the point a to a ground potential, eliminating bond resistance.

The strip line 2 functions as a microstrip line in cooperation with the ground electrode 4 and the dielectric substrate 1. The first electrode opening 5a functions as a slit (slot) disposed between the waveguide 9 and the strip line 2, and a transmission mode component of the strip line 2 and a transmission mode component of the waveguide 9 is coupled to each other only in a predetermined transmission mode. That is, a magnetic field component of the microstrip line is coupled to a TE10 mode component of the waveguide 9 through the first electrode opening 5a, achieving line transduction.

Accordingly, a signal is transduced between the microstrip line and the waveguide 9 with low loss.

Next, the construction of a high-frequency component incorporating a line transducer will be described with reference to FIGS. 3A to 3D and FIG. 4.

Figure 3A:
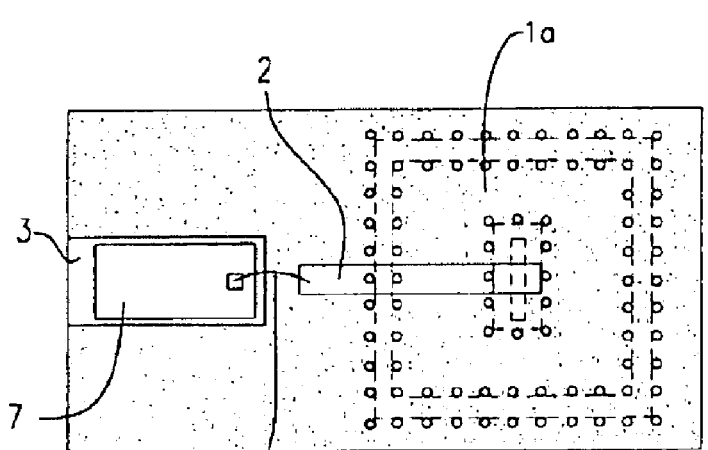
FIGS. 3A, 3B, 3C and 3D are a plan view, a side sectional view, a bottom view, and a side sectional view, respectively, of a dielectric substrate of a high-frequency component incorporating a line transducer according to a second embodiment of the present invention.
Figure 3D:
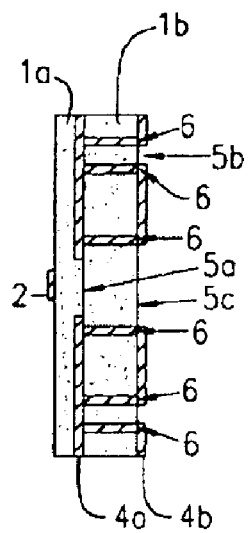
Figure 3B:
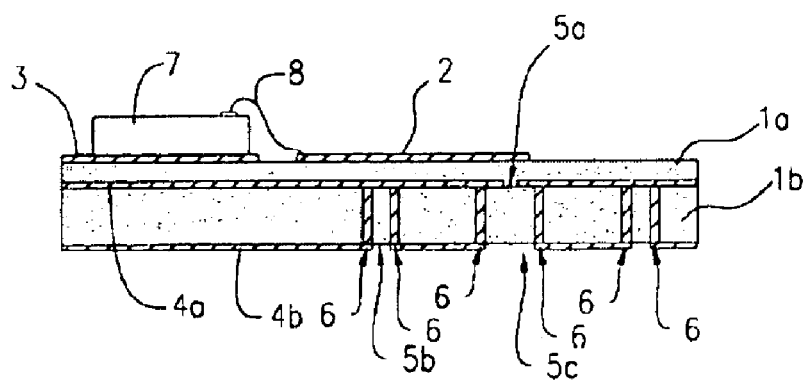
Figure 3C:
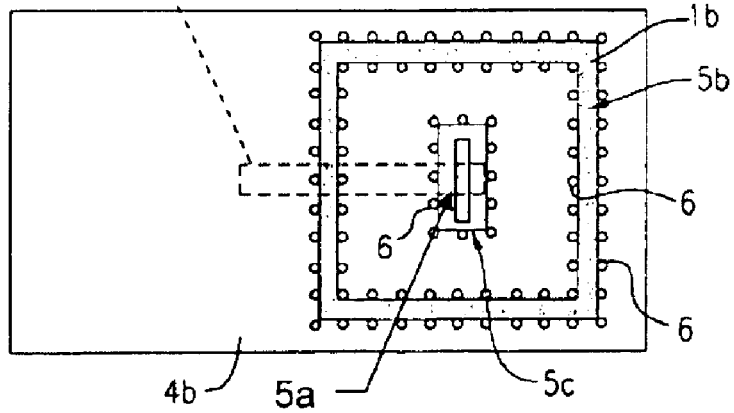
Figure 4:
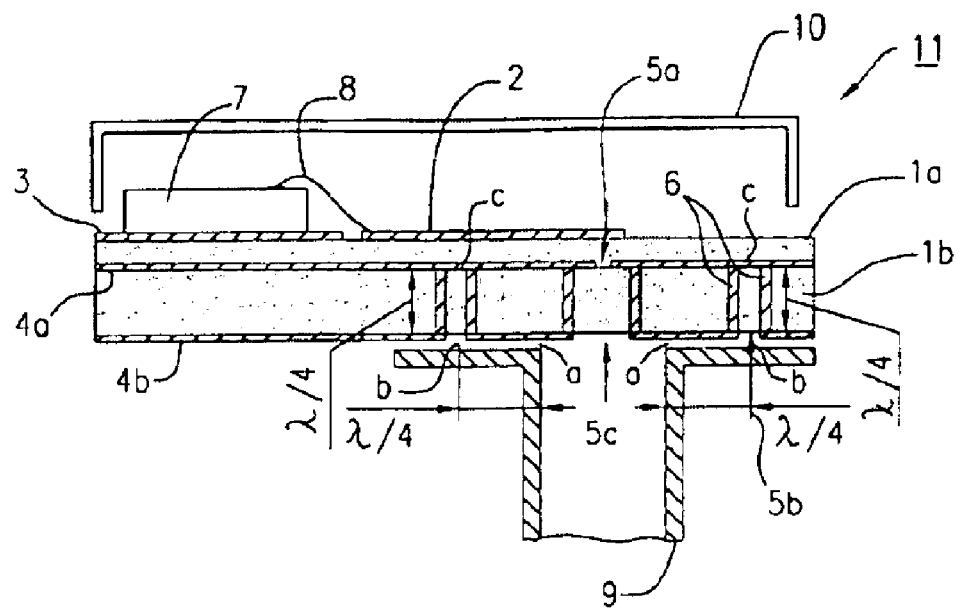
FIG. 4 is a side sectional view of the high-frequency component incorporating the line transducer according to the second embodiment.

FIGS. 3A to 3D are, respectively, a plan view, a side sectional view, a bottom view, and a side sectional view of a dielectric substrate of the high-frequency component incorporating the line transducer, and FIG. 4 is a side sectional view thereof, in which a waveguide is connected to the dielectric substrate.

Referring to FIGS. 3A to 3D, on a surface of a first dielectric substrate 1a, shown in FIG. 3A, a strip line 2 having one end thereof open and the other end thereof connected to a high-frequency element 7 via a wire 8, and a ground electrode 3 associated with the high-frequency element 7, are formed. On another surface of the first dielectric substrate 1a, opposite to the surface on which the strip line 2 is formed, a ground electrode 4a is formed, and in a region opposite to the open end of the strip line 2, a first electrode opening 5a is formed. Furthermore, on the surface with the ground electrode 4a, a second dielectric substrate 1b having a thickness substantially one quarter of a transmission signal wavelength λ/4 is laminated. On a surface of the second dielectric substrate 1b, shown in FIG. 3C, a ground electrode 4b, a second electrode opening 5c disposed in a region opposite to the first electrode opening 5a, and a third electrode opening 5b separated outward by a predetermined distance from the second electrode opening 5c, are formed. Furthermore, in the periphery of the second electrode opening 5c and in the periphery of the third electrode opening 5b, a plurality of via holes 6 electrically connecting the ground electrode 4a and the ground electrode 4b is formed in an array.

Furthermore, as shown in FIG. 4, the second dielectric substrate 1b and a waveguide 9 are disposed in proximity to each other so that a center of the second electrode opening 5c of the second dielectric substrate 1b coincides with a center of the waveguide 9. The third electrode opening 5b is formed so that a center line of the width thereof is separated outward substantially by one quarter of the signal wavelength λ/4 from a conductor wall of the waveguide 9, and the thickness of the second dielectric substrate 1b is also formed with a thickness of substantially one quarter of the signal wavelength λ/4. Furthermore, on the surface with the strip line 2 of the first dielectric substrate 1a, the strip line 2, the ground electrode 3, the high-frequency element 7, and the wire 8 are covered by a case 10, forming a high-frequency component 11. The high-frequency element 7 is connected to an external circuit via a transmission line other than the strip line 2.

Referring to FIG. 4, the distance between points a and b and the distance between points b and c are each $\lambda/4$, the distance between points a and c is $\lambda/2$, and the points a and b are open and the point c is short-circuited. Accordingly, a space formed between the waveguide 9 and the ground electrode 4 of the dielectric substrate 1 and a space inside the dielectric substrate 1, surrounded by the plurality of via holes 6, form a choke circuit. The choke circuit equivalently pulls the point a to a ground potential, eliminating bond resistance.

The strip line 2 functions as a microstrip line in cooperation with the ground electrode 4 and the first dielectric substrate 1a. The first electrode opening 5a functions as a slit (slot) disposed between the waveguide 9 and the strip line 2, and a transmission mode component of the strip line 2 and a transmission mode component of the waveguide 9 is coupled to each other only in a predetermined transmission mode. That is, a magnetic field component of the microstrip line is coupled to a TE10 mode component of the waveguide 9 through the first electrode opening 5a, achieving line transduction with spurious response suppressed.

Furthermore, a dielectric region in the second dielectric substrate 1b, surrounded by the plurality of via holes 6 formed in the periphery of the second electrode opening 5c, matches the impedance of the first electrode opening 5a functioning as the slit (slot) and the impedance of the waveguide 9. Since the thickness of the second dielectric substrate 1b is substantially one quarter of the signal wavelength $\lambda/4$, the dielectric region functions as a matching layer. The matching layer further reduces loss in line transduction.

Furthermore, by proving the matching layer and the choke circuit on the same dielectric substrate, i.e., on the second dielectric substrate 1b, configuration of components can be simplified, allowing reduction in the overall size of line transducer and reduction in manufacturing cost.

Furthermore, although the thickness of a dielectric substrate on which a transmission line is formed is generally thin relative to a transmission signal wavelength $\lambda$, by providing a matching layer having a thickness of $\lambda/4$ in addition to a layer on which the transmission line is formed, the thickness of the dielectric substrate on which the transmission line is formed need not be one quarter of the transmission signal wavelength $\lambda/4$. Accordingly, the thickness of a dielectric substrate on which a transmission line is to be formed can be determined arbitrarily, increasing flexibility in design.

Next, the construction of a high-frequency component incorporating a line transducer according to a third embodiment will be described with reference to FIG. 5.

Figure 5:
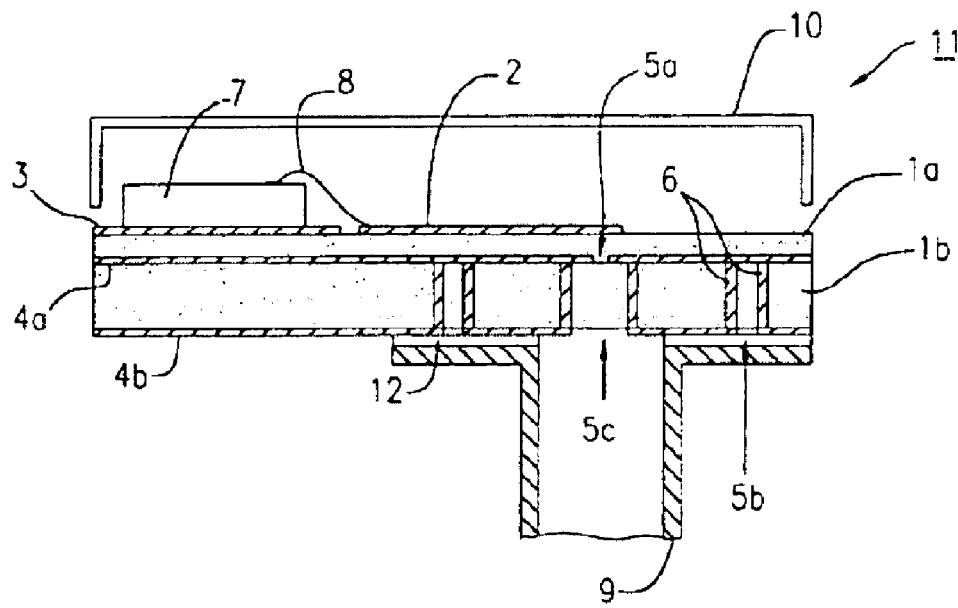
FIG. 5 is a side sectional view of a high-frequency component incorporating a line transducer according to a third embodiment of the present invention.

FIG. 5 is a side sectional view of the high-frequency component, in which a waveguide is connected to a dielectric substrate.

The construction of the high-frequency component incorporating the line transducer shown in FIG. 5 is such that, in the high-frequency component according to the second embodiment, connection between the second dielectric substrate 1b and the waveguide 9 is formed using an insulating adhesive agent 12, and the construction is otherwise the same as that of the second embodiment. Use of the insulating adhesive agent 12 increases the strength of the physical connection between the second dielectric substrate 1b and the waveguide 9, thus stabilizing the connection. Furthermore, insulating adhesive agents are less expensive compared with conductive adhesive agents such as a brazing alloy (e.g., AuSn), so that mounting cost is reduced. Accordingly, a high-frequency component incorporating a line transducer can be implemented at a lower cost.

Next, the construction of a high-frequency component incorporating a line transducer according to a fourth embodiment will be described with reference to FIG. 6.

Figure 6:
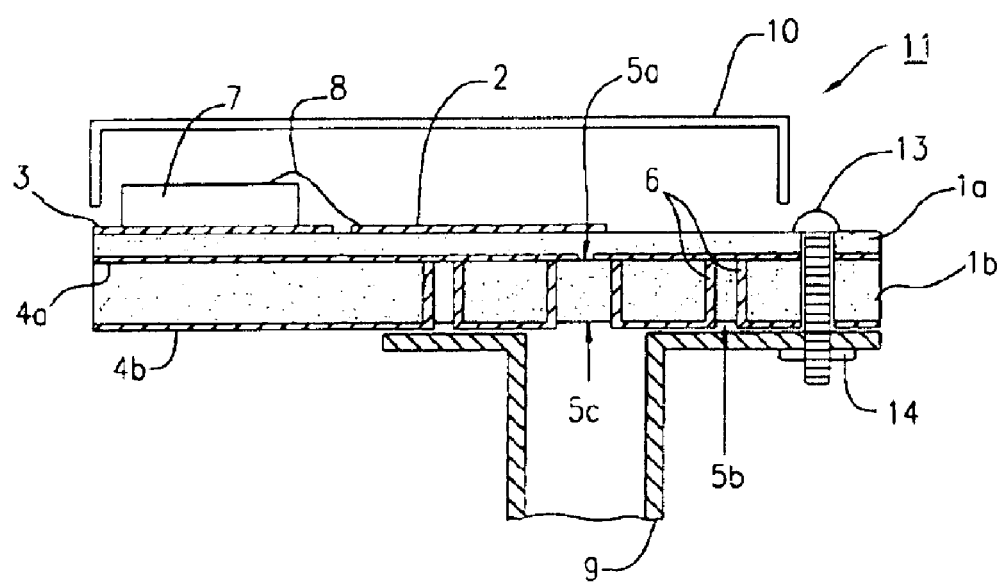
FIG. 6 is a side sectional view of a high-frequency component incorporating a line transducer according to a fourth embodiment of the present invention.
Figure 7A:
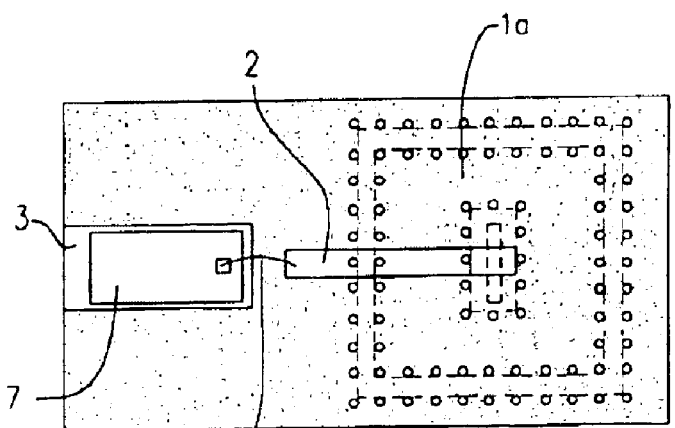
FIGS. 7A, 7B, 7C and 7D are a plan view, a side sectional view, a bottom view, and a side sectional view, respectively, of a dielectric substrate of a high-frequency component incorporating a line transducer according to a fifth embodiment of the present invention.
Figure 7D:
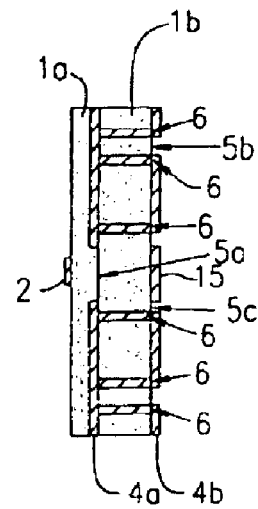
Figure 7B:
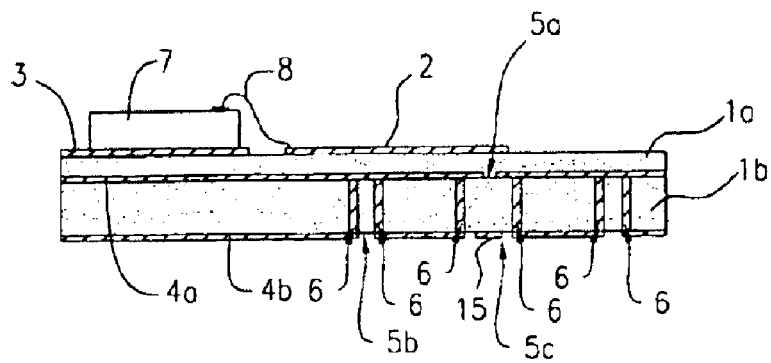
Figure 7C:
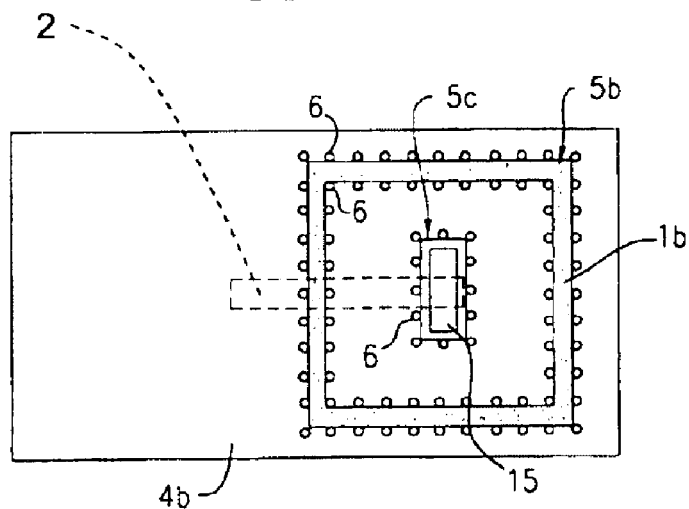

FIG. 6 is a side sectional view of the high-frequency component, in which a waveguide is connected to a dielectric substrate.

The construction of the high-frequency component incorporating the line transducer shown in FIG. 6 is such that, in the high-frequency component according to the second embodiment, connection between the second dielectric substrate 1b and the waveguide 9 is formed using a joining screw 13 and a nut 14, and the construction is otherwise the same as that of the second embodiment. Use of the joining screw 13 and the nut 14 increases the strength of the physical connection between the second dielectric substrate 1b and the waveguide 9, thus stabilizing the connection. A space between the second dielectric substrate 1b and the waveguide 9 functions as part of a choke circuit. Since some variations in the space does not affect the function of the choke circuit, the second dielectric substrate 1b and the waveguide 9 can be readily connected. Accordingly, a high-frequency component incorporating a line transducer having stable transduction characteristics and high reliability can be implemented.

Next, the construction of a high-frequency component incorporating a line transducer according to a fifth embodiment will be described with reference to FIGS. 7A to 7D.

FIGS. 7A to 7D are, respectively, a plan view, a side sectional view, a bottom view, and a side sectional view of a dielectric substrate of the high-frequency component incorporating the line transducer.

The construction of the high-frequency component incorporating the line transducer shown in FIGS. 7A, 7B, 7C and 7D is such that, in the high-frequency component according to the second embodiment, a conductor 15 having a predetermined length and width is formed at a center of the second electrode opening 5c formed on the second dielectric substrate 1b, and the construction is otherwise the same as that of the second embodiment. The structure functions as a multi-stage resonance circuit, allowing matching between the waveguide 9 and the microstrip line formed by the first dielectric substrate 1a, the strip line 2, and the ground electrode 4a in a wider frequency band. Accordingly, a high-frequency component incorporating a line transducer that allows matching in a wider frequency band can be readily implemented.

Next, the construction of a high-frequency component incorporating a line transducer according to a sixth embodiment will be described with reference to FIGS. 8A to 8D.

FIGS. 8A to 8D are, respectively, a plan view, a side sectional view, a bottom view, and a side sectional view of a dielectric substrate of the high-frequency component incorporating the line transducer.

Figure 8A:
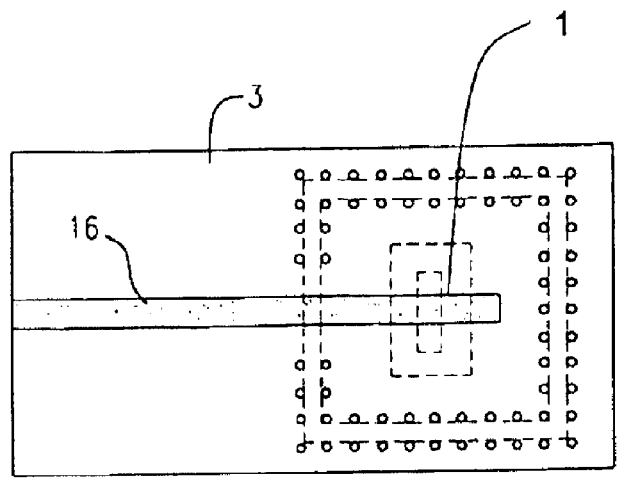
FIGS. 8A, 8B, 8C and 8D are a plan view, a side sectional view, a bottom view, and a side sectional view, respectively, of a dielectric substrate of a high-frequency component incorporating a line transducer according to a sixth embodiment of the present invention.
Figure 8D:
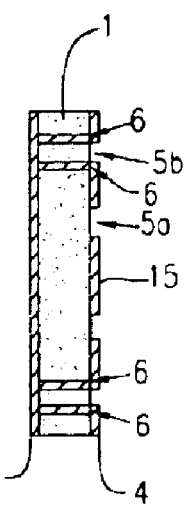
Figure 8B:
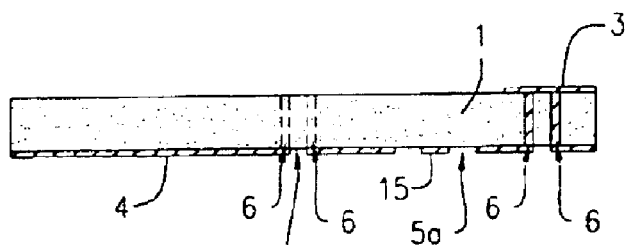

Referring to FIGS. 8A to 8D, on a surface of a dielectric substrate 1, shown in FIG. 8A, a ground electrode 3, and a slot 16, one end thereof being short-circuited, are formed. The other end of the slot 16 is connected to an external circuit and to an element via a line transducer. On another surface of the dielectric substrate 1, shown in FIG. 8C, a ground electrode 4 is formed, a first electrode opening 5a having a predetermined length and width is formed in a region opposite to a region that is separated by a predetermined distance from the short-circuited end of the slot 16, and a conductor 15 having a predetermined length and width is formed at a center of the first electrode opening 5a. Furthermore, a second electrode opening 5b having a predetermined width is formed, separated outward by a predetermined distance from the first electrode opening 5a. In the periphery of the second electrode opening 5b, a plurality of via holes 6 electrically connecting the ground electrode 3 and the ground electrode 4 is formed in an array, except in a region opposite to the slot 16.

Figure 8C:
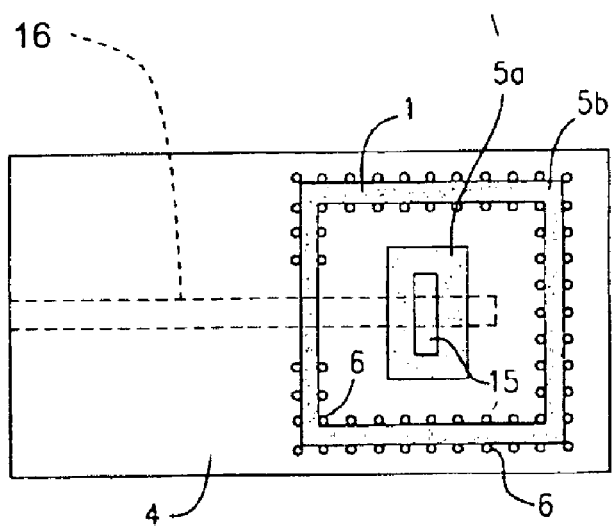

Furthermore, similarly to the embodiments described above, a waveguide is disposed in proximity to the surface shown in FIG. 8C.

The slot 16 functions as a slot line (grounded slot line) in cooperation with the ground electrode 4 and the dielectric substrate 1. The conductor 15 is coupled to the waveguide 9 and to the slot line, and a transmission mode component of the slot line and a transmission mode component of the waveguide are coupled to each other only in a predetermined transmission mode. That is, a magnetic field component of the slot line and a magnetic field component in TE10 mode of the waveguide 9 are each coupled to the conductor 15, achieving line transduction.

Furthermore, as described earlier in relation to the first embodiment, the function of a choke circuit implemented by a dielectric region surrounded by the second electrode opening 5b and the via holes 6 is activated so as to suppress connection resistance, so that a signal is transduced from the waveguide 9 to the slot line with low loss.

Next, the construction of a high-frequency component incorporating a line transducer according to a seventh embodiment will be described with reference to FIGS. 9A to 9D.

FIGS. 9A to 9D are, respectively, a plan view, a side sectional view, a bottom view, and a side sectional view of a dielectric substrate of the high-frequency component incorporating the line transducer.

The construction of the high-frequency component incorporating the line transducer shown in FIGS. 9A to 9D is such that, in the high-frequency component according to the first embodiment, a conductor 15 having a predetermined length and width is formed at a center of the first electrode opening 5a, and the conductor 15 (FIGS. 9B, 9C, 9D) is electrically connected to the strip line 2 on the opposite surface via a via hole 6a. Even though the conductor 15 formed on the connection surface is electrically connected to the strip line 2, a transmission signal is matched and connection resistance is thus absent, so that a signal is transduced from the waveguide 9 to the strip line without loss.

In the high-frequency components incorporating the line transducers according to the embodiments described above, the substrate may be an alumina fired substrate, a glass ceramic substrate, a resin substrate, etc., and the transmission line may be a coplanar line instead of the forms in the embodiments described above, while similarly transducing a signal between the waveguide and the line formed on the dielectric substrate with low loss.

Next, the construction of a high-frequency module according to an aspect of the present invention will be described with reference to FIG. 10.

Figure 10:
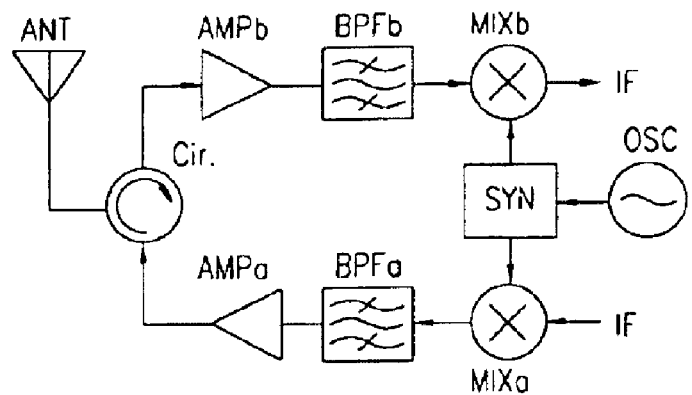
FIG. 10 is a block diagram of a high-frequency module according to an aspect of the present invention.

In FIG. 10, ANT denotes a transmission/reception antenna, Cir. denotes a circulator, BPFa and BPFb respectively denote bandpass filters, AMPa and AMPb respectively denote amplifier circuits, MIXa and MIXb respectively denote mixers, OSC denotes an oscillator, SYN denotes a synthesizer, and IF denotes an intermediate-frequency signal.

The mixer MIXa mixes a modulated signal and a signal output from the synthesizer SYN. The bandpass filter BPFa passes only a transmission frequency band of the mixed signal output from the mixer MIXa. The amplifier circuit AMPa amplifies the power of the passed signal and transmits the amplified signal from the antenna ANT via the circulator Cir. The amplifier circuit AMPb amplifies a reception signal extracted by the circulator Cir. The bandpass filter BPFb passes only a reception frequency band of the amplified reception signal output from the amplifier circuit AMPb. The mixer MIXb mixes a frequency signal output from the synthesizer SYN and the passed reception signal to output an intermediate-frequency signal IF.

AMPa and AMPb shown in the amplifier circuit of FIG. 10 can be implemented using the high-frequency components constructed as shown in FIGS. 1A, 1B, 1C, 1D, 2, 3A, 3B, 3C, 3D, 4, 5, 6, 7A, 7B, 7C, 7D, 8A, 8B, 8C, 8D, 9A, 9B, 9C and 9D. Accordingly, a high-frequency module with low loss and good communication performance can be implemented using the high-frequency components.

Figure 11:
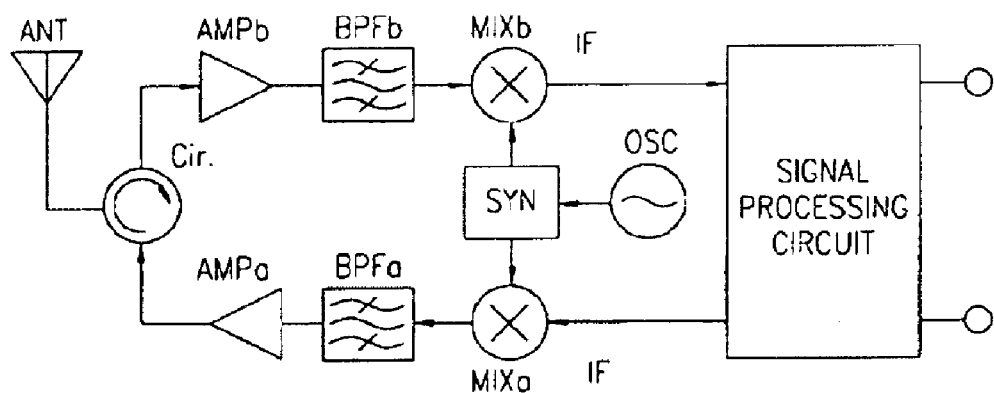
FIG. 11 is a block diagram of a communication apparatus according to a further aspect of the present invention.

Next, the construction of a communication apparatus according to another aspect of the present invention will be described with reference to FIG. 11.

The communication apparatus includes the high-frequency module shown in FIG. 10 and a signal processing circuit. The signal processing circuit shown in FIG. 11 includes a codec circuit, a synchronization control circuit, a modulator, a demodulator, a CPU, etc. The communication apparatus is constructed by further providing a circuit for inputting and outputting transmission and reception signals in the signal processing circuit.

Accordingly, a communication apparatus with low loss and good communication performance can be implemented using the high-frequency module.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency line transducer, comprising:
   a substrate;
   a transmission line disposed on a first surface of the substrate;
   a first ground electrode disposed on the first surface of the substrate;
   a second ground electrode disposed on a second surface of the substrate, the a second surface being opposite the first surface;
   a waveguide positioned so as to oppose the second ground electrode, the waveguide having an opening;
   an electrode opening having a periphery disposed on the second surface of the substrate, the periphery of the electrode opening being centered at substantially one quarter of a signal wavelength from the opening of the waveguide; and
   a plurality of via holes disposed along the periphery of the electrode opening, the plurality of via holes electrically connecting the first ground electrode to the second ground electrode,
   wherein the electrode opening has an inner and an outer periphery and the plurality of via holes are disposed in an array on the inner and the outer periphery of the electrode opening.

2. The high-frequency line transducer according to claim 1, wherein the plurality of via holes have a length substantially equal to one quarter of the signal wavelength.

3. The high-frequency line transducer according to claim 1, wherein the waveguide is positioned such that there is a space between the waveguide and the second ground electrode, the space functioning as part of a choke circuit.

4. The high-frequency line transducer according to claim 1, wherein the plurality of via holes are not disposed in a region corresponding to the transmission line.

5. The high-frequency line transducer according to claim 1, wherein the substrate and the waveguide are connected by an insulating adhesive agent.

6. A communication apparatus comprising:
a high-frequency component which includes:
  a substrate;
  a transmission line disposed on a first surface of the substrate;
  a first ground electrode disposed on the first surface of the substrate;
  a second ground electrode disposed on a second surface of the substrate, the second surface being opposite the first surface;
  a waveguide positioned so as to oppose the second ground electrode, the waveguide having an opening;
  an electrode opening having a periphery disposed on the second surface of the substrate, the periphery of the electrode opening being centered at substantially one quarter of a signal wavelength from the opening of the waveguide; and
  a plurality of via holes disposed along the periphery of the electrode opening, the plurality of via holes electrically connecting the first ground electrode to the second ground electrode;
a signal processing circuit connected to the high-frequency component; and
an antenna connected to the high-frequency component,
  wherein the electrode opening has an inner and an outer periphery and the plurality of via holes are disposed in an array on the inner and the outer periphery of the electrode opening.

7. The communication apparatus according to claim 6, wherein the plurality of via holes are not disposed in a region corresponding to the transmission line.

8. The communication apparatus according to claim 6, wherein the substrate and the waveguide are connected by an insulating adhesive agent.

9. The communication apparatus according to claim 6, wherein the waveguide is positioned such that there is a space between the waveguide and the second ground electrode, the space functioning as part of a choke circuit.

10. The communication apparatus according to claim 6, wherein the plurality of via holes have a length substantially equal to one quarter of the signal wavelength.

* * * * *